United States Patent
Saikawa

(10) Patent No.: US 8,651,623 B2
(45) Date of Patent: Feb. 18, 2014

(54) INKJET RECORDING HEAD AND METHOD OF MANUFACTURING INKJET RECORDING HEAD

(71) Applicant: Canon Kabushiki Kaisha, Tokyo (JP)

(72) Inventor: Hideo Saikawa, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/687,991

(22) Filed: Nov. 28, 2012

(65) Prior Publication Data

US 2013/0135394 A1    May 30, 2013

(30) Foreign Application Priority Data

Nov. 30, 2011  (JP) ................................ 2011-262134

(51) Int. Cl.
*B41J 2/14* (2006.01)
*B41J 2/16* (2006.01)

(52) U.S. Cl.
USPC .............................................. 347/50; 347/59

(58) Field of Classification Search
USPC ................. 347/40, 42, 47–50, 58–59
See application file for complete search history.

(56) References Cited

U.S. PATENT DOCUMENTS 5,278,584 A * 1/1994 Keefe et al. ..................... 347/63
8,272,708 B2 * 9/2012 Silverbrook et al. ........... 347/14

FOREIGN PATENT DOCUMENTS

JP    2006-140452 A    6/2006

* cited by examiner

*Primary Examiner* — Thinh Nguyen
(74) *Attorney, Agent, or Firm* — Canon USA Inc IP Division

(57) ABSTRACT

An inkjet recording head includes: plural element substrates from which ink is ejected; and a flexible wiring substrate which includes a first wiring area, a second wiring area and a bending portion, the first wiring area including plural openings in which the element substrates are placed and which includes, in the periphery thereof, electrode terminals electrically connected to the element substrates, and the bending portion being bent between the first wiring area and the second wiring area. The flexible wiring substrate includes a slit which extends between the plural openings and reaches the bending portion or a position further than the bending portion from an end portion of the flexible wiring substrate on the side on which the first wiring area is provided, at a position opposite to the bending portion.

18 Claims, 10 Drawing Sheets

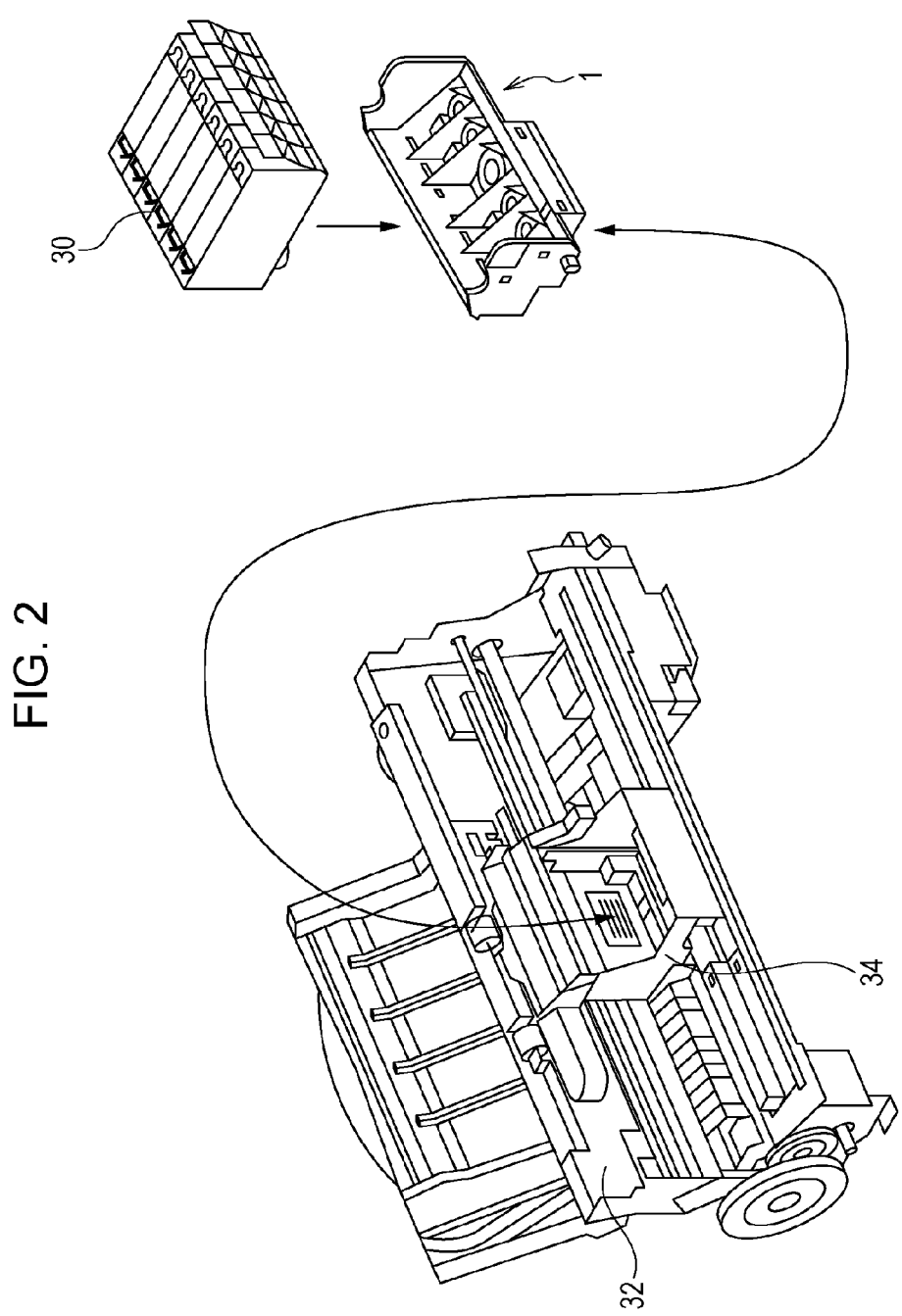

INKJET RECORDING HEAD AND METHOD OF MANUFACTURING INKJET RECORDING HEAD

BACKGROUND OF THE INVENTION

1. Field of the Invention

The present disclosure relates to an inkjet recording head and a method of manufacturing the inkjet recording head.

2. Description of the Related Art

An inkjet recording head includes a recording element substrate (hereafter, also referred to as "element substrate") which includes ejection ports through which ink is ejected. Japanese Patent Laid-Open No. 2006-140452 discloses an exemplary configuration of inkjet recording head: in the disclosed configuration, a flexible wiring substrate is electrically connected to plural recording element substrates and signals are transmitted to the recording element substrates via the flexible wiring substrate.

Such a configuration in which plural recording element substrates are connected to a single flexible wiring substrate as that disclosed by Japanese Patent Laid-Open No. 2006-140452 may have the following problem.

If the flexible wiring substrate and the recording element substrates are electrically connected and then are fixed to a fixing member, such as a support substrate, the relative positions of the plural recording element substrates at the time of electric connection of the flexible wiring substrate and the plural recording element substrates may be different from the relative positions of the plural recording element substrates after the fixation to the fixing member. For this reason, at the time of fixation of the flexible wiring substrate and the recording element substrates to the fixing member, there is a possibility that the flexible wiring substrate is fixed to the fixing member in a distorted manner if the relative positions of the plural recording element substrates are precisely determined.

The same problem may occur in a case in which the flexible wiring substrate and the recording element substrates are electrically connected and then the flexible wiring substrate is fixed to the fixing member after the plural recording element substrates are aligned with each other and are fixed to the fixing member. That is, when the electrode terminals provided in the flexible wiring substrate and the electrode sections provided in the recording element substrate are electrically connected, there is a possibility that the electrode terminals and the electrode sections are misaligned due to variation in manufacture of the parts. Then, when the electrode terminals of the flexible wiring substrate are aligned with and electrically connected to the electrode sections of the recording element substrate which has been fixed to the fixing member and then the flexible wiring substrate is fixed to the fixing member, the flexible wiring substrate may be fixed to the fixing member in a distorted manner.

As described above, when the flexible wiring substrate is fixed in a distorted manner to a surface on which the recording element substrate is disposed, sealability of a cap may be decreased due to the distortion of the flexible wiring substrate when the cap is fit to absorb ink from the recording element substrate.

SUMMARY OF THE INVENTION

The present disclosure provides an inkjet recording head capable of reducing creation of distortion of a flexible wiring substrate on a surface on which an element substrate is disposed even in a configuration in which plural element substrates are connected to a single flexible wiring substrate. The present disclosure also provides a method of manufacturing this inkjet recording head.

According to an aspect of the present disclosure, an inkjet recording head is provided which includes: plural element substrates from which ink is ejected; and a flexible wiring substrate which includes a first wiring area, a second wiring area and a bending portion, the first wiring area including plural openings in which the element substrates are placed and which includes, in the periphery thereof, electrode terminals electrically connected to the element substrates, and the bending portion being bent between the first wiring area and the second wiring area, in which the flexible wiring substrate includes a slit which extends between the plural openings and reaches the bending portion or a position further than the bending portion from an end portion of the flexible wiring substrate on the side on which the first wiring area is provided, at a position opposite to the bending portion.

The ideas and concepts presented in this disclosure are configured to provide an inkjet recording head capable of reducing creation of distortion of a flexible wiring substrate on a surface on which an element substrate is disposed even in a configuration in which plural element substrates are connected to a single flexible wiring substrate, and also provide a method of manufacturing this inkjet recording head.

Further features according to the present disclosure will become apparent from the following description of exemplary embodiments with reference to the attached drawings.

BRIEF DESCRIPTION OF THE DRAWINGS

FIG. 2 is a perspective view of an inkjet recording apparatus to which the inkjet recording head according to the present disclosure is attached.

DESCRIPTION OF THE EMBODIMENTS

Hereinafter, embodiments of the present disclosure will be described with reference to the drawings.

First Embodiment

Figure 1A:
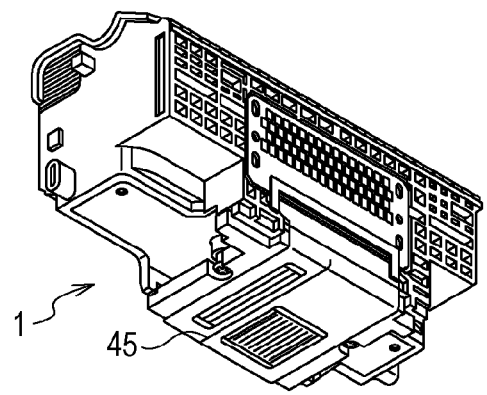
FIG. 1A is a perspective view illustrating an inkjet recording head as disclosed herein.
Figure 1B:
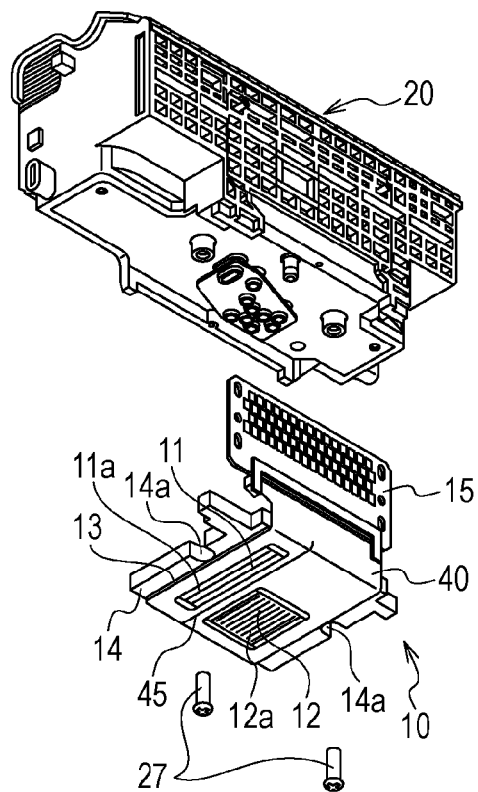
FIG. 1B is an exploded perspective view of units of the inkjet recording head illustrated in FIG. 1A.
Figure 1C:
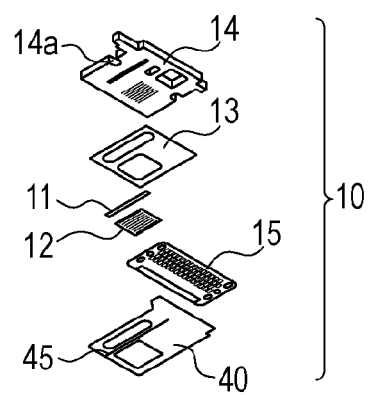
FIG. 1C is an exploded perspective view of parts of a recording element unit.

FIG. 1A is a perspective view illustrating an inkjet recording head 1 according to the present disclosure. FIG. 1B is an exploded perspective view of units of the inkjet recording head 1. FIG. 1C is an exploded perspective view illustrating a recording element unit 10 which constitutes the inkjet recording head 1.

FIG. 2 is a perspective view illustrating the inkjet recording head 1 and an inkjet recording apparatus main body 32 to which the inkjet recording head 1 is attached. The inkjet recording head 1 is attached to a carriage 34 provided in the inkjet recording apparatus main body 32. Plural ink tanks 30 are attached to the inkjet recording head 1 in a manner to be independently removed.

As illustrated in FIG. 1B, the inkjet recording head 1 includes the recording element unit 10 and an ink supply unit 20. The ink tank 30 is attached to the ink supply unit 20. The ink supply unit 20 supplies the recording element unit 10 with ink contained in the ink tank 30. The recording element unit 10 and the ink supply unit 20 are fixed to each other with screws 27.

Components of the recording element unit 10 will be described in detail below. The recording element unit 10 includes a first recording element substrate 11, a second recording element substrate 12, a first plate 14, an electrical wiring tape 40 ("flexible wiring substrate"), an electric contact substrate 15 and a second plate 13.

The first recording element substrate 11 includes an ejection port array 11a. The second recording element substrate 12 includes an ejection port array 12a. These ejection port arrays 11a and 12a include plural ejection ports through which ink is ejected. An electrothermal transducer which causes film boiling in the ink in accordance with an electrical signal is provided corresponding to the ejection port. Since the ink is ejected by film boiling, the electrothermal transducer functions as an energy generator which generates energy for the ejection of the ink ("recording element"). Here, the first recording element substrate 11 is used for the ejection of black pigment ink, and the second recording element substrate 12 is used for the ejection of color dye ink. The first recording element substrate 11 and the second recording element substrate 12 are bonded to and fixed to the first plate 14.

The first plate 14 is made of, for example, an aluminum oxide (Al2O3) material of which thickness is 2 to 10 mm. Ink supply ports for supplying ink to the first recording element substrate 11 and to the second recording element substrate 12 are formed in the first plate 14. Screw stops 14a are formed at both ends of the first plate 14. Each of the screws 27 used to fix the ink supply unit 20 is placed in each of the screw stops 14a.

The second plate 13 is made of, for example, an aluminum oxide material of which thickness is 0.5 to 1 mm. The second plate 13 includes two openings: the first recording element substrate 11 is placed in one of the openings, of which outer diameter is greater than that of the first recording element substrate 11; and the second recording element substrate 12 is placed in the other of the openings, of which outer diameter is greater than that of the second recording element substrate 12. The second plate 13 is bonded to and fixed to the first plate 14.

The electrical wiring tape 40 forms an electrical signal path for electrical signals which are applied to the first recording element substrate 11 and to the second recording element substrate 12. In accordance with the electrical signals, the ink is ejected. The electrical wiring tape 40 is electrically connected to the first recording element substrate 11 and to the second recording element substrate 12. The electrical wiring tape 40 includes two openings: the first recording element substrate 11 is placed in one of the openings; and the second recording element substrate 12 is placed in the other of the openings.

The electric contact substrate 15 is electrically connected to the electrical wiring tape 40. The electric contact substrate 15 includes plural contact pads for receiving the electrical signals from the inkjet recording apparatus main body 32 (see FIG. 2).

Figure 3A:
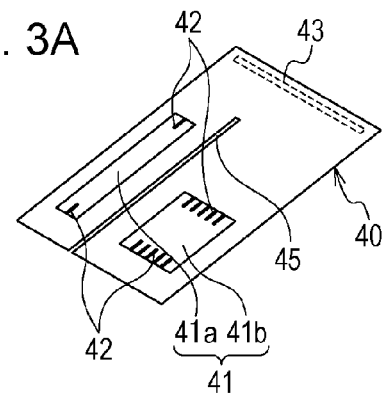
FIGS. 3A to 3F are schematic diagrams illustrating a method of manufacturing an inkjet recording head of a first embodiment.
Figure 3D:
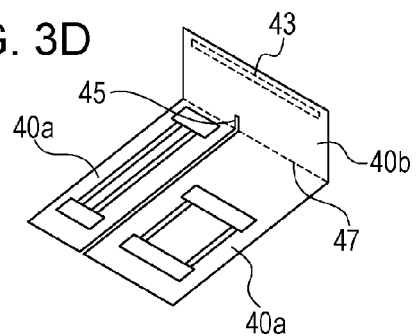
Figure 3B:
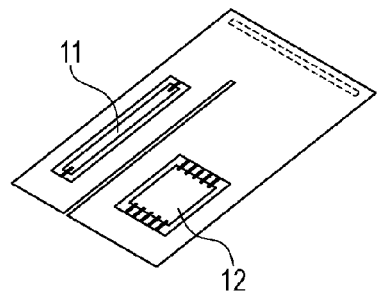
Figure 3E:
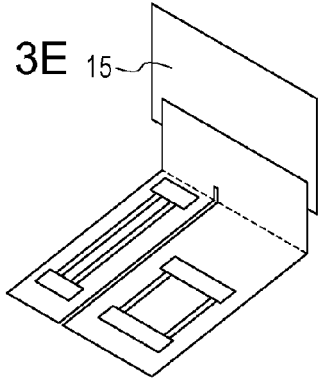
Figure 3C:
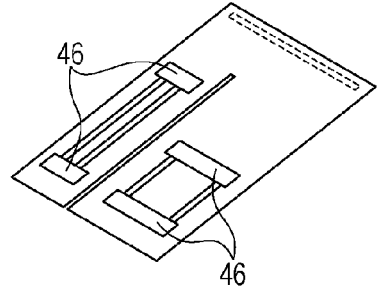
Figure 3F:
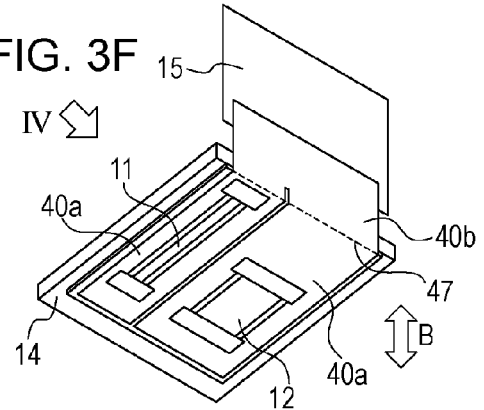
Figure 4:
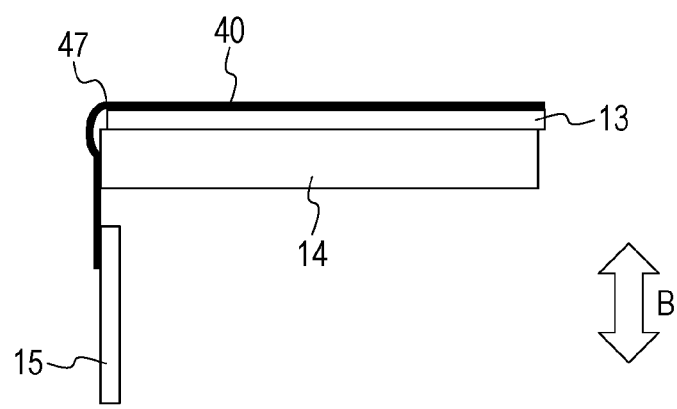
FIG. 4 is a diagram of the inkjet recording head illustrated in FIG. 3F seen from the direction of arrow IV.
Figure 5:
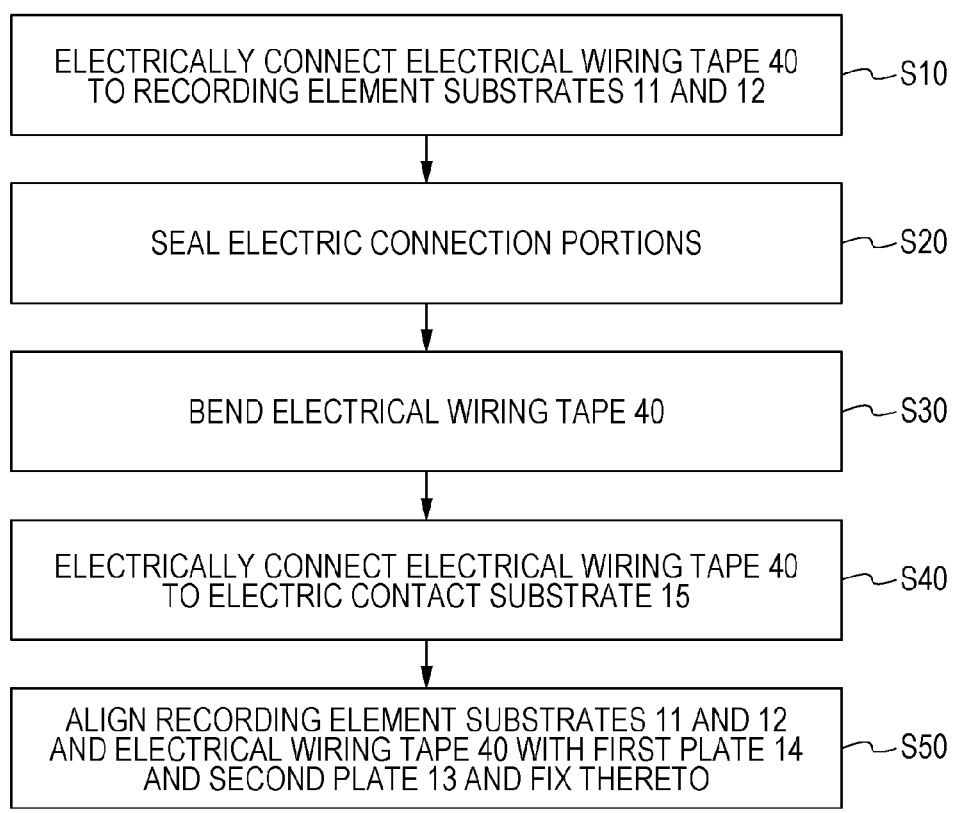
FIG. 5 is a flowchart illustrating a method of manufacturing the inkjet recording head of the first embodiment.

Next, assembly of the recording element unit 10 of the present embodiment will be described in detail with reference to FIGS. 3A to 3F, 4 and 5. FIGS. 3A to 3F are schematic diagrams illustrating a method of manufacturing the inkjet recording head 1 of the first embodiment. FIG. 4 is a diagram of the inkjet recording head 1 illustrated in FIG. 3F seen from the direction of arrow IV. FIG. 5 is a flowchart illustrating the method of manufacturing the inkjet recording head 1 of the first embodiment.

The electrical wiring tape 40 will be described with reference to FIG. 3A. The electrical wiring tape 40 includes two openings 41 (41a and 41b): the first recording element substrate 11 is placed in the opening 41a; and the second recording element substrate 12 is placed in the opening 41b. Electrode terminals 42 are formed near the peripheries of the openings 41. The electrode terminals 42 are connected to the electrode sections of the recording element substrate 11 and to the electrode sections of the recording element substrate 12. An electric terminal connection portion 43 is formed at an end of the electrical wiring tape 40. The electrical wiring tape 40 and the electric contact substrate 15 are electrically connected at the electrical terminal connection portion 43. The electrode terminals 42 and the electric terminal connection portion 43 are in communication with each other by a continuous wiring pattern made of metal (for example, copper foil). The electrical wiring tape 40 includes a slit 45 situated between the opening 41a and opening 41b. The slit 45 extends toward the electric terminal connection portion 43 from an end of the electrical wiring tape 40 opposite to the end at which the electric terminal connection portion 43 is provided.

First, the electrical wiring tape 40 is electrically connected to the first recording element substrate 11 and to the second recording element substrate 12 at S10 of FIG. 5. FIG. 3B is a diagram illustrating the state in which the first recording element substrate 11 and the second recording element substrate 12 are electrically connected to the electrical wiring tape 40. After the first recording element substrate 11 and the second recording element substrate 12 are aligned with each other at a predetermined distance, the electrical wiring tape 40 is electrically connected to the first recording element substrate 11 and to the second recording element substrate 12. An exemplary method for electric connection is thermal stress bonding in which the electrode terminals 42 of the electrical wiring tape 40 are placed over the electrode sections of the recording element substrate 11 and over the electrode sections of the recording element substrate 12 and then stress and heat are applied to establish electric connection. Alternative method is thermal ultrasonic bonding in which electric connection is established by the application of ultrasonic wave with heat.

Next, the electric connection portions at which the first recording element substrate 11 and the second recording element substrate 12 are electrically connected to the electrical wiring tape 40 are sealed with a sealing agent 46 at S20 of FIG. 5. FIG. 3C is a diagram illustrating the state in which the electric connection portions at which the first recording element substrate 11 and the second recording element substrate 12 are electrically connected to the electrical wiring tape 40 are sealed with the sealing agent 46. Sealing protects the electric connection portions from ink-induced corrosion or external impact. The electric connection portions may be sealed from both upper and lower sides with the same or plural different sealing agents.

Next, at S30 of FIG. 5, the electrical wiring tape 40 of which electric connection portions have been sealed is bent at about 90 degrees at the bending portion 47. FIG. 3D is a diagram illustrating the state in which the electrical wiring tape 40 of which electric connection portions have been sealed is bent at the bending portion 47. The electrical wiring tape 40 includes a first wiring area 40a and a second wiring area 40b formed on both sides of the bending portion 47. The first wiring area 40a is an area situated on one side of the bending portion 47 in which the electrode terminals 42 connected to the first recording element substrate 11 and to the second recording element substrate 12 are provided. The second wiring area 40b is an area situated on the other side of the bending portion 47 opposite to the side on which the first wiring area 40a is situated. In the present embodiment, the electric terminal connection portion 43 is provided in the second wiring area 40b. The electrical wiring tape 40 may be bent at normal temperature, or desirably, a temperature higher than the normal temperature.

At S40 of FIG. 5, the electrical wiring tape 40 and the electric contact substrate 15 are electrically connected. FIG. 3E is a diagram illustrating the state in which the electrical wiring tape 40 and the electric contact substrate 15 are electrically connected. The terminals of the electrical wiring tape 40 and the electric contact substrate 15 are connected after being aligned with each other by, for example, image processing such that the terminals thereof are in contact with each other. The electric connection is established by, for example, thermal compression bonding in which heat and pressure are applied to the electrical wiring tape 40 and the electric contact substrate 15 between which an anisotropy conductive film or the like is interposed.

The first plate 14 and the second plate 13 are bonded to each other and form a combined body ("fixing member"). At S50 of FIG. 5, the first recording element substrate 11 and the second recording element substrate 12 are aligned with the first plate 14 at positions exposed through the openings formed in the second plate 13 of the fixing member. The first recording element substrate 11 and the second recording element substrate 12 are bonded to and fixed to predetermined positions on the first plate 14. FIG. 3F is a diagram illustrating the state in which the first recording element substrate 11 and the second recording element substrate 12 are bonded to and fixed to the first plate 14 at the predetermined positions exposed through the openings formed in the second plate 13. The first recording element substrate 11 and the second recording element substrate 12 are placed into the openings of the second plate 13. At the same time, the electrical wiring tape 40 is aligned with an upper surface of the second plate 13 and is bonded and fixed there by an adhesive.

In the configuration of the present embodiment, the first recording element substrate 11, the second recording element substrate 12 and the electrical wiring tape 40 are fixed to the fixing member which is a combined body of the first plate 14 and the second plate 13. Alternatively, the fixing member may be an integrated part.

If the first recording element substrate 11 and the second recording element substrate 12 are fixed to the first plate 14 at positions different from the predetermined positions, there is a possibility that ink droplets ejected from the recording element substrates 11 and 12 land on a recording medium at positions different from the predetermined positions and, as a result, image quality is affected. In order to address this problem, at S50 of FIG. 5, the first recording element substrate 11 and the second recording element substrate 12 are aligned precisely with the predetermined positions on the first plate 14 and fixed thereto.

However, at S10 of FIG. 5, in the state in which the two recording element substrates 11 and 12 and the electrical wiring tape 40 are electrically connected, misalignment in relative positions of the recording element substrate 11 and the recording element substrate 12 may occur with reference to the relative positions at S50 of FIG. 5. At the time of aligning the first recording element substrate 11 and the second recording element substrate 12 with each other at S50 of FIG. 5, there is a possibility that the first wiring area 40a of the electrical wiring tape 40 is fixed to the second plate 13 in a distorted manner. If the first wiring area 40a of the electrical wiring tape 40 is fixed in a distorted manner, sealing performance of a cap which is used to absorb the ink from the recording element substrates 11 and 12 is affected. The distortion applies load to the electric connection portions at which the electrode terminals 42 of the electrical wiring tape 40 are electrically connected to the recording element substrates 11 and 12.

In order to address this problem, the slit 45 is formed in the electrical wiring tape 40 in the first wiring area 40a which is an area disposed on the second plate 13. The slit 45 extends between the opening 41a and the opening 41b from the end of the electrical wiring tape 40 opposite to the end at which the bending portion 47 is situated and reaches a position further than the bending portion 47 (see FIG. 3F). In this configuration, when the recording element substrates 11 and 12 and the electrical wiring tape 40 are aligned with the combined body of the first plate 14 and the second plate 13 at S50 of FIG. 5, the distortion of the electrical wiring tape 40 is moved not toward the first wiring area 40a but toward the second wiring area 40b which is connected to the electric contact substrate 15.

As illustrated in FIG. 4 which is a diagram of FIG. 3F seen from the direction of arrow IV, the electrical wiring tape 40 is loosened in the direction of B to absorb position misalignment during the electric connection of the electrical wiring tape 40 and the electric contact substrate 15. Therefore, the electrical wiring tape 40 is loosened near the bending portion 47.

In this configuration, the slit 45 allows the distortion which may be produced in the first wiring area 40a of the electrical wiring tape 40 described above to be moved toward the portion at which the electrical wiring tape 40 is connected to the electric contact substrate 15 and allows the distortion to be absorbed in the loosened portion near the bending portion 47 of the electrical wiring tape 40 illustrated in FIG. 4. Therefore, creation of distortion in the first wiring area 40a of the electrical wiring tape 40 may be reduced. It is necessary for the electrical wiring tape 40 to have a degree of rigidity to move the distortion of the electrical wiring tape 40.

According to the present embodiment, it is possible to reduce creation of distortion of the first wiring area 40a of the electrical wiring tape 40 and, therefore, it is possible to reduce sealing performance of a cap which is used to absorb the ink from the recording element substrates 11 and 12. The load applied to the electric connection portions at which the electrode terminals 42 of the electrical wiring tape 40 are electrically connected to the recording element substrates 11 and 12 is reduced, and thereby electrical reliability is increased.

In a configuration in which a single electrical wiring tape is connected to a single recording element substrate, distortion of the electrical wiring tape 40 may be reduced. The present embodiment, in which a single electrical wiring tape is connected to plural recording element substrates, has the following advantages. Since a single electrical wiring tape is used, a gap between electrical wiring tapes does not exist and, therefore, an area of the electric terminal connection portion 43 of the electric contact substrate 15 connected to the electrical wiring tape 40 may be reduced. In this configuration, the size of the electric contact substrate 15 is further reduced. Since a single electrical wiring tape is used, the connection between the electrical wiring tape 40 and the electric contact substrate 15 may be established with reduced time, the inkjet recording head may be manufactured at even lower cost.

Even in a configuration in which the slit 45 does not reach the second wiring area 40b, but reaches the bending portion 47, distortion which may be produced in the first wiring area 40a is absorbed by the loosened portion near the bending portion 47. Therefore, it is sufficient that the slit 45 is formed to reach the bending portion 47 or the position further than the bending portion 47.

Processes of the method of manufacturing the inkjet recording head 1 are not necessarily performed in the order described above. It is only necessary that the recording element substrates 11 and 12 and the electrical wiring tape 40, which is electrically connected to the recording element substrates 11 and 12 and which includes the bending portion 47, are prepared and, thereafter, the recording element substrates 11 and 12 and the electrical wiring tape 40 are aligned with and fixed to the fixing member.

The problem described above may be caused in a configuration in which the recording element substrates 11 and 12 are fixed to the fixing member and, thereafter, the recording element substrates 11 and 12 are electrically connected to the electrical wiring tape 40 and the electrical wiring tape 40 is fixed to the fixing member. That is, there is a possibility that, when the electrode terminals 42 provided in the electrical wiring tape 40 and the electrode sections provided in the recording element substrates 11 and 12 are electrically connected, their positions are misaligned due to variation in manufacture of the parts. In this case, when the electrode terminals 42 of the electrical wiring tape 40 are aligned with, connected to, and fixed to the electrode sections of the recording element substrates 11 and 12 which are fixed to the fixing member, there is a possibility that the first wiring area 40a of the electrical wiring tape 40 is fixed in a distorted manner. Therefore, even in such a configuration, since the slit 45 described above is formed in the electrical wiring tape 40, creation of distortion in the first wiring area 40a of the electrical wiring tape 40 may be reduced.

Second Embodiment

A second embodiment will be described with reference to FIGS. 6A to 6F, 7A, 7B and 8. The present embodiment differs from the embodiment described above in the order of the process of sealing the electric connection portions at which the recording element substrate and the electrical wiring tape are connected with a sealing agent.

Figure 6A:
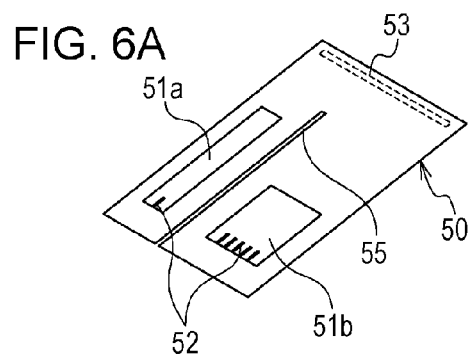
FIGS. 6A to 6F are schematic diagrams illustrating a method of manufacturing the inkjet recording head of a second embodiment.
Figure 6D:
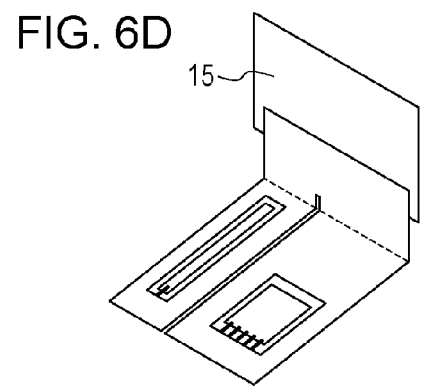
Figure 6B:
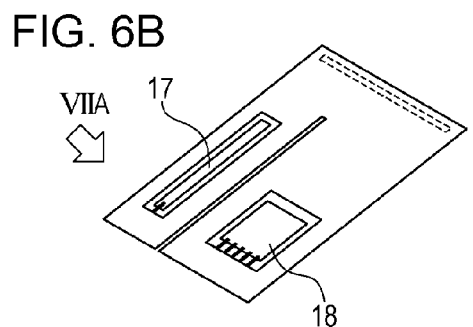
Figure 6E:
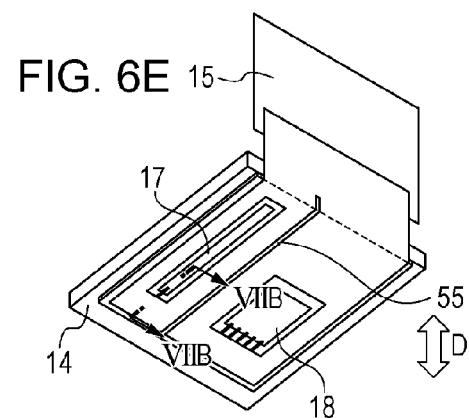
Figure 6C:
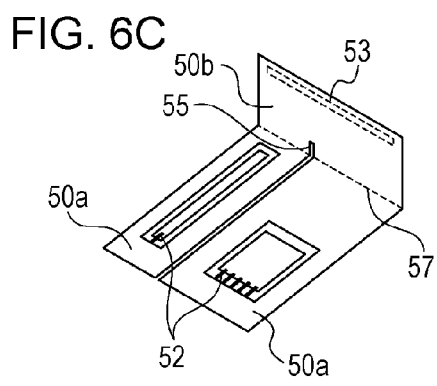
Figure 6F:
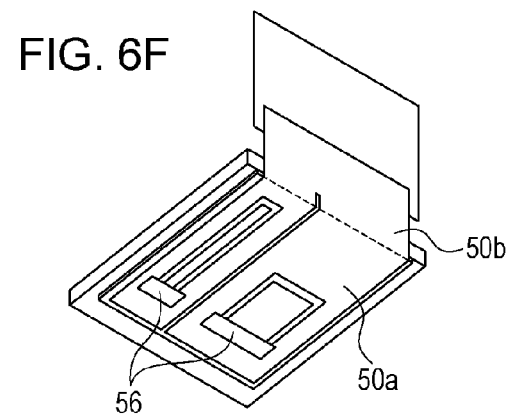
Figure 7A:
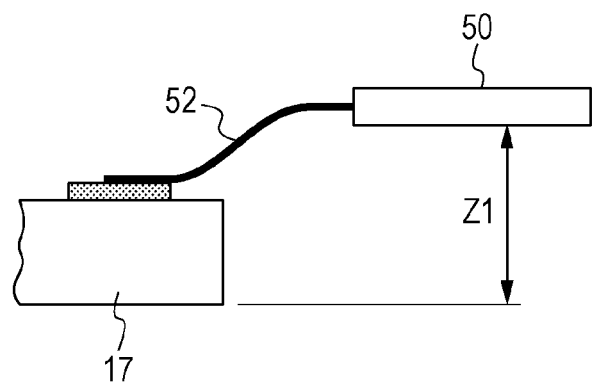
FIGS. 7A and 7B are schematic diagrams illustrating relative positions of a recording element substrate and an electrical wiring tape in a process of manufacturing the inkjet recording head of the second embodiment.
Figure 7B:
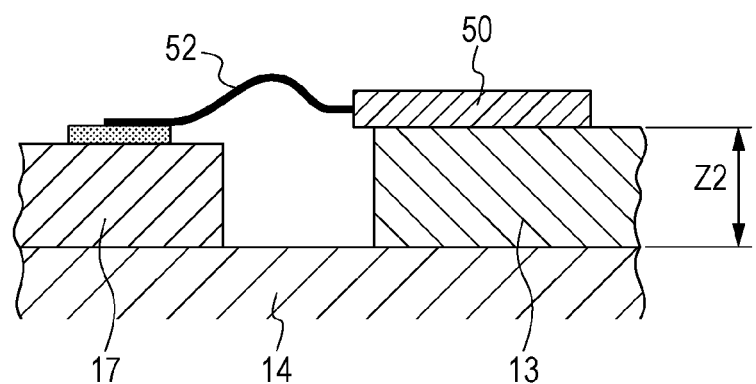
Figure 8:
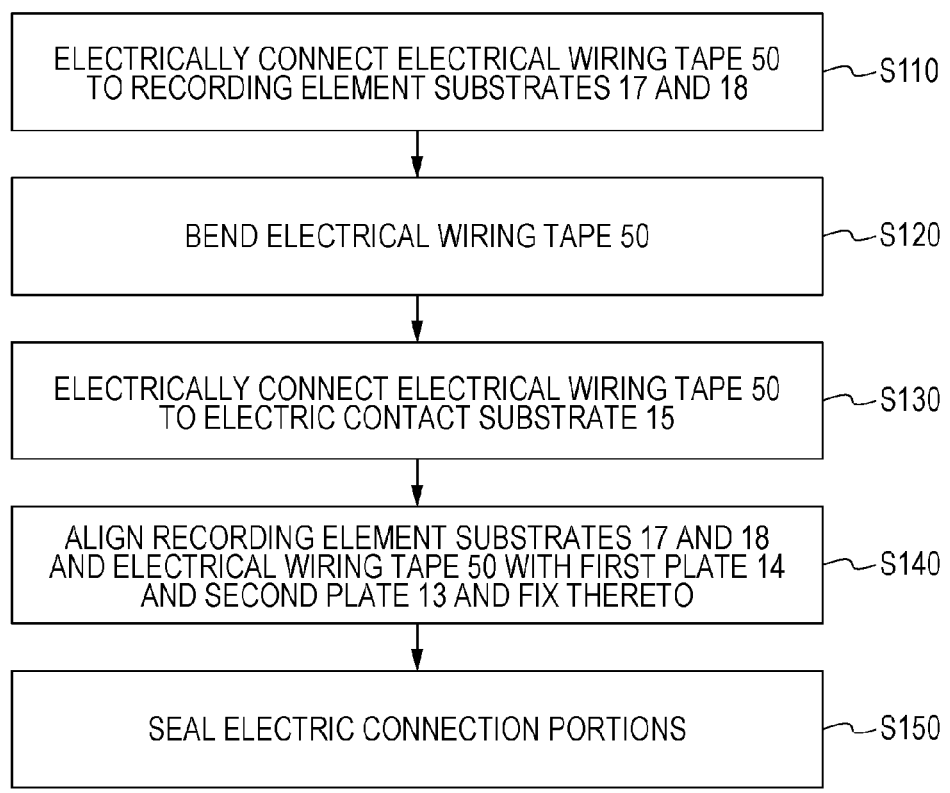
FIG. 8 is a flowchart illustrating a method of manufacturing the inkjet recording head of the second embodiment.

FIGS. 6A to 6F are schematic diagrams illustrating a method of manufacturing an inkjet recording head 1 of the second embodiment. FIGS. 7A and 7B are schematic diagrams illustrating relative positions of a recording element substrate 17 and an electrical wiring tape 50 in a process of manufacturing the inkjet recording head 1. FIG. 8 is a flowchart illustrating the method of manufacturing the inkjet recording head 1 of the second embodiment.

The electrical wiring tape 50 will be described with reference to FIG. 6A. The electrical wiring tape 50 includes two openings 51 (51a and 51b): the first recording element substrate 17 is placed in the opening 51a; and a second recording element substrate 18 is placed in the opening 51b. Electrode terminals 52 are formed near the edge portions of the openings 51 at one side of the openings 51a and 51b. The electrode terminals 52 are connected to the electrode sections of the recording element substrate 17 and to the electrode sections of the recording element substrate 18. An electric terminal connection portion 53 is formed at an end of the electrical wiring tape 50. The electrical wiring tape 50 and the electric contact substrate 15 are electrically connected at the electrical terminal connection portion 53. The electrode terminals 52 and the electric terminal connection portion 53 are in communication with each other by a continuous wiring pattern made of metal (for example, copper foil). The electrical wiring tape 50 includes a slit 55 situated between the opening 51a and the opening 51b. The slit 55 extends toward the electric terminal connection portion 53 from an end of the electrical wiring tape 50 opposite to the end at which the electric terminal connection portion 53 is provided.

First, the electrical wiring tape 50 is electrically connected to the first recording element substrate 17 and to the second recording element substrate 18 at S110 of FIG. 8. FIG. 6B is a diagram illustrating the state in which the first recording element substrate 17 and the second recording element substrate 18 are electrically connected to the electrical wiring tape 50. After the first recording element substrate 17 and the second recording element substrate 18 are aligned with each other at a predetermined distance, the electrical wiring tape 50 is electrically connected to the first recording element substrate 17 and to the second recording element substrate 18. FIG. 7A is a diagram of FIG. 6B seen from the direction of arrow VIIA. In this state, the distance between a surface of the first recording element substrate 17 on which the first recording element substrate 17 is to be bonded to the first plate 14 and a surface of the electrical wiring tape 50 on which the electrical wiring tape 50 is to be bonded to the second plate 13 regarding a direction vertical to the surface of the first recording element substrate 17 on which the first recording element substrate 17 is to be bonded to the first plate 14 is Z1.

Next, at S120 of FIG. 8, the electrical wiring tape 50 is bent to about 90 degrees at a bending portion 57. FIG. 6C is a diagram illustrating the state in which the electrical wiring tape 40 after the electric connection is bent at the bending portion 57. The electrical wiring tape 50 includes a first wiring area 50a and a second wiring area 50b formed on both sides of the bending portion 57. The first wiring area 50a is an area situated on one side of the bending portion 57 in which the electrode terminals 52 connected to the first recording element substrate 17 and to the second recording element substrate 18 are provided. The second wiring area 50b is an area situated on the other side of the bending portion 57 opposite to the side on which the first wiring area 50a is situated. In the present embodiment, the electric terminal connection portion 53 is provided in the second wiring area 50b.

At S130 of FIG. 8, the electrical wiring tape 50 and the electric contact substrate 15 are electrically connected. FIG. 6D is a diagram illustrating the state in which the electrical wiring tape 50 and the electric contact substrate 15 are electrically connected. The terminals of the electrical wiring tape 50 and the electric contact substrate 15 are connected after being aligned with each other by, for example, image processing such that the terminals thereof are in contact with each other. The electric connection is established by, for example, thermal compression bonding in which heat and pressure are applied to the electrical wiring tape 50 and the electric contact substrate 15 between which an anisotropy conductive film or the like is interposed.

The first plate 14 and the second plate 13 are bonded to each other and form a combined body. At S140 of FIG. 8, the first recording element substrate 17 and the second recording element substrate 18 are aligned with each other and are fixed to the first plate 14 at positions exposed through the openings formed in the second plate 13 of the fixing member. Then, the first recording element substrate 17 and the second recording element substrate 18 are bonded to and fixed to the first plate 14. FIG. 6E is a diagram illustrating the state in which the first recording element substrate 17 and the second recording element substrate 18 are bonded to and fixed to the first plate 14 at the predetermined positions exposed through the openings formed in the second plate 13. The first recording element substrate 17 and the second recording element substrate 18 are placed into the openings of the second plate 13. At the same time, the electrical wiring tape 50 is aligned with an upper surface of the second plate 13 and is bonded and fixed there by an adhesive.

FIG. 7B is a partial cross-sectional view along line E-E of FIG. 6E. In this state, the distance between a surface of the first recording element substrate 17 on which the first recording element substrate 17 is bonded to the first plate 14 and a surface of the electrical wiring tape 50 on which the electrical wiring tape 50 is bonded to the second plate 13 regarding a direction vertical to the surface of the first recording element substrate 17 on which the first recording element substrate 17 is bonded to the plate 14 is Z2. The relationship of Z1, which is illustrated in FIG. 7A, and Z2 is Z2<Z1 and, therefore, the electrode terminal 52 has a loosened portion as illustrated in FIG. 7B.

Next, the electric connection portions at which the first recording element substrate 17 and the second recording element substrate 18 are electrically connected to the electrical wiring tape 50 are sealed with a sealing agent 56 at S150 of FIG. 8. FIG. 6F is a diagram illustrating the state in which the electric connection portions at which the first recording element substrate 17 and the second recording element substrate 18 are electrically connected to the electrical wiring tape 50 are sealed with the sealing agent 56. Sealing protects the electric connection portions from ink-induced corrosion or external impact.

Also in the present embodiment, in the same manner as in the first embodiment, the slit 55 allows the distortion that may be created in the first wiring area 50a of the electrical wiring tape 50 disposed on the second plate 13 to be moved toward the portion at which the electrical wiring tape 50 is connected to the electric contact substrate 15. The distortion is absorbed in the loosened portion near the bending portion 57 of the electrical wiring tape. Therefore, creation of distortion in the first wiring area 50a of the electrical wiring tape 50 may be reduced.

In the present embodiment, the electric connection portions at which the first recording element substrate 17 and the second recording element substrate 18 are electrically connected to the electrical wiring tape 50 are not sealed in the process of S140 of FIG. 8. Therefore, in addition to the loosened portion near the bending portion 57, the loosened portion in the electrode terminal 52 may also absorb the distortion created in the portion of the electrical wiring tape 50 on the second plate 13.

Third Embodiment

In the first embodiment described above, the slit 45 formed in the first wiring area 40a of the electrical wiring tape 40 extends in the direction in which the plural ejection ports are arranged, i.e., the direction of the ejection port array 11a. The present embodiment differs from the first embodiment described above in that the slit of the electrical wiring tape extends in the direction which crosses the direction in which the plural ejection ports are arranged.

Figure 9:
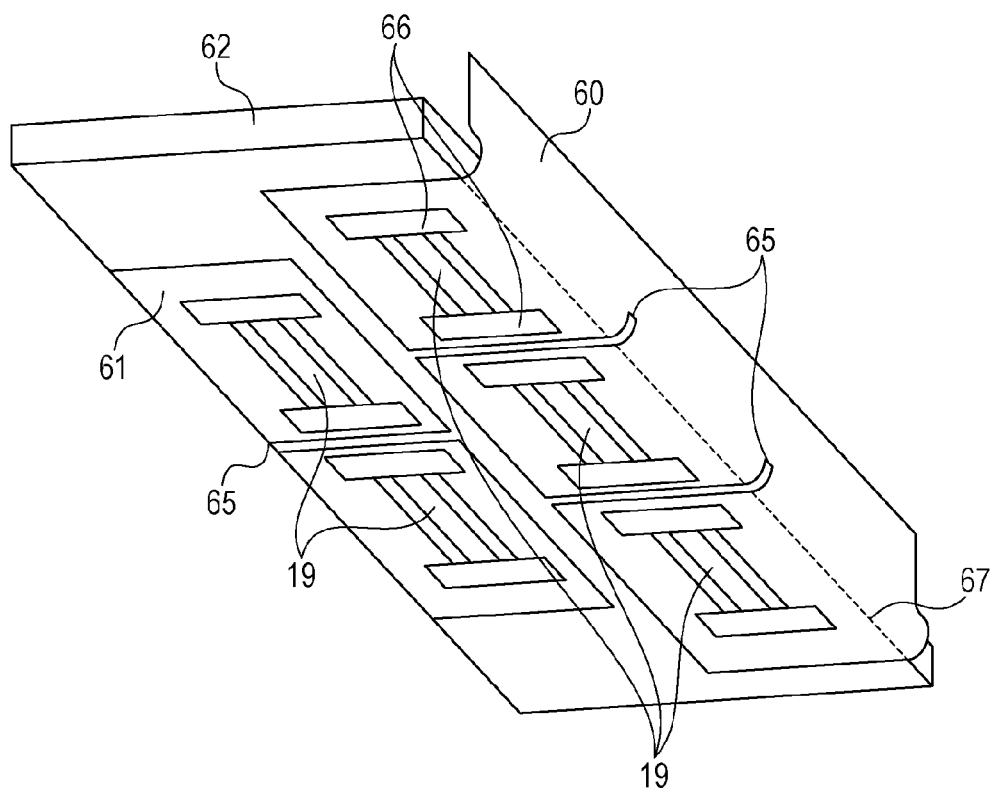
FIG. 9 is a schematic diagram illustrating a part of an inkjet recording head of a third embodiment.

The third embodiment will be described with reference to FIG. 9. An electrical wiring tape 60 is electrically connected to plural recording element substrates 19. A connection portion of the electrical wiring tape 60 and the plural recording element substrates 19 is sealed with a sealing agent 66. The electrical wiring tape 60 and the plural recording element substrates 19 are aligned with each other, and then bonded to and fixed to a plate 62. Similarly, an electrical wiring tape 61 is electrically connected to the plural recording element substrates 19 and their connection portions are sealed. Thereafter, the electrical wiring tape 61 and the plural recording element substrates 19 are aligned with each other, and then bonded to and fixed to the plate 62.

Slits 65 are disposed on the electrical wiring tapes 60 and 61 to reach positions further than the bending portion 67. In areas of the electrical wiring tapes 60 and 61 disposed on the plate 62, the slits 65 are formed in a direction which crosses the direction in which plural ejection ports are arranged (the longitudinal direction of the recording element substrate 19 in FIG. 9).

In this configuration, distortion of the electrical wiring tapes 60 and 61 which may be created in the portion disposed on the surface of the plate 62 on which the recording element substrate 19 is disposed is absorbed by the slits 65 at loosened portions near the bending portion 67. Therefore, creation of distortion in the electrical wiring tapes 60 and 61 on the surface of the plate 62 on which the recording element substrate 19 is disposed may be reduced.

Fourth Embodiment

In the first embodiment described above, the openings 41 are formed in the electrical wiring tape 40 and the electrode terminals 42 are formed in the openings 41. It is also possible, as in the present embodiment, electrode terminals are provided at end portions of the first wiring area while no opening is formed in a first wiring area of an electrical wiring tape.

Figure 10:
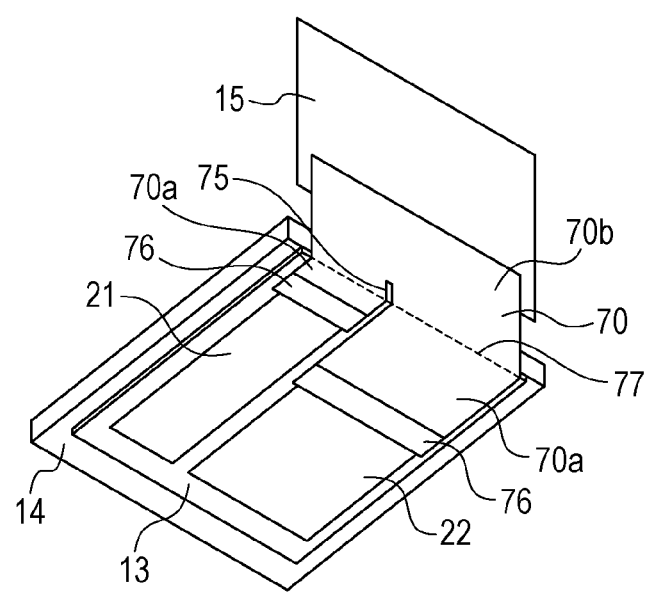
FIG. 10 is a schematic diagram illustrating an inkjet recording head of a fourth embodiment.

A fourth embodiment will be described with reference to FIG. 10. An electrical wiring tape 70 is electrically connected to a first recording element substrate 21 and a second recording element substrate 22, and their connection portions are sealed with a sealing agent 76. The electrical wiring tape 70 includes a first wiring area 70a and a second wiring area 70b on both sides of a bending portion 77. Electrode terminals for electric connection with the first recording element substrate 21 and the second recording element substrate 22 are provided at end portions of the first wiring area 70a. The second wiring area 70b is connected to a contact substrate 15.

In the present embodiment, a slit 75 is provided between the first recording element substrate 21 and the second recording element substrate 22, and extends from an end portion of the first wiring area 70a to reach a position further than the bending portion 77. In this configuration, the distortion which may be created in the first wiring area 70a, which is a portion of the electrical wiring tape 70 disposed on the second plate 13 is absorbed by a slit 75 in a loosened portion near the bending portion 77. It is therefore possible to reduce creation of distortion in the first wiring area 70a of the electrical wiring tape 70.

In the embodiments described above, ink is ejected by film boiling caused by application of electrical energy to the electrothermal transducer: however, other systems for ejecting ink may be employed. For example, ink may be ejected by the deformation of a piezoelectric element.

In the embodiments described above, the electrical wiring tape is bent at a substantially right angle with the surface on which the electrical wiring tape is fixed; however, the angle is not necessarily right. Desirably, the angle of the bending portion is about 30 degrees to about 150 degrees.

In the embodiments described above, the electric contact substrate 15 is provided in the inkjet recording head 1; however, the electric contact substrate 15 is not necessarily provided.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2011-262134 filed Nov. 30, 2011, which is hereby incorporated by reference herein in its entirety.

What is claimed is:

1. An inkjet recording head, comprising:
    plural element substrates from which ink is ejected; and
    a flexible wiring substrate which includes a first wiring area, a second wiring area and a bending portion, the first wiring area including plural openings in which the element substrates are placed, and which includes, in a periphery thereof, electrode terminals electrically connected to the element substrates, and the bending portion being bent between the first wiring area and the second wiring area,
    wherein the flexible wiring substrate includes a slit provided between the plural openings and extending to the bending portion, or a position further than the bending portion, from an end portion of the flexible wiring substrate on the side on which the first wiring area is provided, at a position opposite to the bending portion.

2. The inkjet recording head according to claim 1, further comprising a fixing member to which the plural element substrates and the first wiring area are fixed.

3. The inkjet recording head according to claim 1, wherein the slit formed in the first wiring area extends in a direction in which plural ejection ports provided on the element substrate through which ink is ejected are arranged.

4. The inkjet recording head according to claim 1, wherein the slit formed in the first wiring area extends in a direction which crosses a direction in which plural ejection ports provided on the element substrate through which ink is ejected are arranged.

5. An inkjet recording head, comprising:
    plural element substrates from which ink is ejected; and
    a flexible wiring substrate which includes a first wiring area, a second wiring area and a bending portion, the first wiring area including, at an end portion thereof, electrode terminals which are electrically connected to the element substrates, and the bending portion being bent between the first wiring area and the second wiring area,
    wherein the flexible wiring substrate includes a slit which extends from the end portion of the first wiring area to the bending portion or a position further than the bending portion and is provided corresponding to a position between the plural element substrates.

6. The inkjet recording head according to claim 5, further comprising a fixing member, to which the plural element substrates and the first wiring area are fixed.

7. The inkjet recording head according to claim 5, wherein the slit formed in the first wiring area extends in a direction in which plural ejection ports provided on the element substrate through which ink is ejected are arranged.

8. The inkjet recording head according to claim 5, wherein the slit formed in the first wiring area extends in a direction which crosses a direction in which plural ejection ports provided on the element substrate through which ink is ejected are arranged.

9. The inkjet recording head according to claim 5, wherein the slit is provided as a border between the element substrates adjacent to each other.

10. A method of manufacturing an inkjet recording head, comprising:
    preparing plural element substrates from which ink is ejected, and a flexible wiring substrate which includes a first wiring area, a second wiring area, a bending portion and a slit, the first wiring area including plural openings in which the element substrates are placed and which includes, in the periphery thereof, electrode terminals electrically connected to the element substrates, and the bending portion being bent between the first wiring area and the second wiring area, and the slit being provided between the plural openings and extends to the bending portion or a position further than the bending portion from an end portion of the flexible wiring substrate on the side on which the first wiring area is provided, at a position opposite to the bending portion; and
    aligning the plural element substrates and the flexible wiring substrate with a fixing member, and fixing the plural element substrates and the flexible wiring substrate to the fixing member.

11. The method of manufacturing the inkjet recording head according to claim 10, wherein, before fixing the plural element substrates and the flexible wiring substrate to the fixing member, electric connection portions at which the plural element substrates and the electrode terminal are connected are sealed with a sealing agent.

12. The method of manufacturing the inkjet recording head according to claim 10, wherein, after fixing the plural element substrates and the flexible wiring substrate to the fixing member, electric connection portions at which the plural element substrates and the electrode terminal are connected are sealed with a sealing agent.

13. The method of manufacturing the inkjet recording head according to claim 10, wherein a distance between a surface of the element substrates on which the element substrate is fixed to the fixing member and the first wiring area regarding a direction vertical to the surface of the element substrate after the fixation is shorter than the distance at the time of electrical connection of the plural element substrates and the flexible wiring substrate.

14. A method of manufacturing an inkjet recording head, comprising:
    aligning plural element substrates from which ink is ejected, with a fixing member and fixing the plural element substrates to the fixing member; and
    electrically connecting, to the element substrates, electrode terminals of a flexible wiring substrate which includes a first wiring area, a second wiring area, a bending portion and a slit, the first wiring area including the plural openings in which the element substrates are placed and which includes, in a periphery thereof, the electrode terminals and the bending portion being bent between the first wiring area and the second wiring area, and the slit which is provided between the plural openings and extends to the bending portion or a position further than the bending portion from an end portion of the flexible wiring substrate on the side on which the first wiring area is provided, at a position opposite to the bending portion, and fixing the flexible wiring substrate to the fixing member.

15. A method of manufacturing an inkjet recording head, comprising:

preparing plural element substrates from which ink is ejected, and a flexible wiring substrate which includes a first wiring area, a second wiring area, a bending portion and a slit, the first wiring area including, at an end portion thereof, electrode terminals which are electrically connected to the element substrates, and the bending portion being bent between the first wiring area and the second wiring area, the slit extending from the end portion of the first wiring area to the bending portion or a position further than the bending portion and being provided corresponding to a position between the plural element substrates; and aligning the plural element substrates and the flexible wiring substrate with a fixing member and fixing the plural element substrates and the flexible wiring substrate to the fixing member.

16. The method of manufacturing the ink jet recoding head according to claim 15, wherein the slit is provided as a border between the element substrates adjacent to each other.

17. A method of manufacturing an inkjet recording head, comprising:

aligning plural element substrates from which ink is ejected with a fixing member and fixing the plural element substrates to the fixing member; and electrically connecting, to the element substrate, electrode terminals of a flexible wiring substrate which includes a first wiring area, a second wiring area, a bending portion and a slit, the first wiring area including the electrode terminals at an end portion thereof, and the bending portion being bent between the first wiring area and the second wiring area, the slit extending from the end portion of the first wiring area to the bending portion or a position further than the bending portion and being provided corresponding to a position between the plural element substrates and fixing the flexible wiring substrate to the fixing member.

18. The method of manufacturing the ink jet recoding head according to claim 17, wherein the slit is provided as a border between the element substrates adjacent to each other.

\* \* \* \* \*